US011500018B2

(12) United States Patent
Shen et al.

(10) Patent No.: US 11,500,018 B2
(45) Date of Patent: Nov. 15, 2022

(54) ASYNCHRONOUS CIRCUITS AND TEST METHODS

(71) Applicants: Taiwan Semiconductor Manufacturing Co., Ltd., Hsinchu (TW); National Taiwan University, Taipei (TW)

(72) Inventors: Ting-Yu Shen, Hsinchu (TW); Chien-Mo Li, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 17/359,315

(22) Filed: Jun. 25, 2021

(65) Prior Publication Data
US 2021/0325458 A1 Oct. 21, 2021

Related U.S. Application Data

(62) Division of application No. 16/540,400, filed on Aug. 14, 2019, now Pat. No. 11,047,911.
(Continued)

(51) Int. Cl.
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31716* (2013.01); *G01R 31/31723* (2013.01); *G01R 31/318536* (2013.01); *G01R 31/31721* (2013.01)

(58) Field of Classification Search
CPC .......... G01R 31/3177; G01R 31/31716; G01R 31/31723; G01R 31/318536; G01R 31/31721
See application file for complete search history.

(56) References Cited

U.S. PATENT DOCUMENTS 6,973,422 B1 * 12/2005 Yadavalli ................ G06F 30/33
714/33
9,291,674 B1 3/2016 Lu et al.
(Continued)

OTHER PUBLICATIONS

Huang et al., "Test Methodology for Dual-rail Asynchronous Circuits," 54th ACM/EDAC/IEEE Design Automation Conference (DAC), Jun. 18-22, 2017, Austin, TX, 6 pages.
(Continued)

*Primary Examiner* — Kyle Vallecillo
(74) *Attorney, Agent, or Firm* — Seed IP Law Group LLP

(57) ABSTRACT

Circuits, methods, and systems are provided which facilitate testing of asynchronous circuits having one or more global or local feedback loops. A circuit includes a data path and a scan path. The data path has an input configured to receive a data input signal, and a first output. The scan path includes a first multiplexer having a first input configured to receive the data input signal, a latch coupled to an output of the first multiplexer, a scan isolator coupled to an output of the latch, and a second multiplexer having a first input coupled to the first output of the data path and a second input coupled to an output of the scan isolator. The second multiplexer is configured to output a data output signal.

20 Claims, 10 Drawing Sheets

Related U.S. Application Data

(60) Provisional application No. 62/752,820, filed on Oct. 30, 2018.

(56) References Cited

U.S. PATENT DOCUMENTS

| | | | |
|---|---|---|---|
| 9,297,855 B1* | 3/2016 | Jindal | G06F 30/30 |
| 2005/0077918 A1* | 4/2005 | Teifel | H03K 19/17736 |
| | | | 326/41 |
| 2011/0128051 A1 | 6/2011 | Kumar et al. | |
| 2012/0124433 A1 | 5/2012 | Policke et al. | |
| 2014/0040688 A1 | 2/2014 | Zhang et al. | |
| 2017/0146599 A1 | 5/2017 | Wang et al. | |
| 2018/0059178 A1 | 3/2018 | Wang et al. | |

OTHER PUBLICATIONS

Petlin et al., "Scan Testing of Asynchronous Sequential Circuits," Proceedings of the Fifth Great Lakes Symposium on VLSI, Mar. 16-18, 1995, Buffalo, NY, pp. 224-229.

Te Beest et al., "Automatic Scan Insertion and Test Generation for Asynchronous Circuits," Proceedings of the International Test Conference, Baltimore, MD, Oct. 10, 2002, pp. 804-813.

\* cited by examiner

ASYNCHRONOUS CIRCUITS AND TEST METHODS

BACKGROUND

Asynchronous circuits may be generally described as sequential digital logic circuits which are not governed by a clock circuit or a global clock signal. Instead, asynchronous circuits use signals that indicate completion of instructions and operations which may be specified by simple data transfer protocols. While most digital devices currently use synchronous circuits, which rely on a clock signal, asynchronous circuits are gaining attention due to various advantages over conventional synchronous designs, including, for example, lower power consumption, lower electromagnetic interference, better modularity, better average-case performance, better robustness against process variation, and more.

However, testing asynchronous circuits can be more difficult than testing synchronous circuits for a variety of reasons. One such reason is that asynchronous circuits have lower controllability and observability compared to traditional synchronous circuits, since asynchronous circuits do not have a clock signal. Moreover, conventional testing methodologies, including Automatic Test Pattern Generation (ATPG) techniques, do not support testing of asynchronous circuits.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
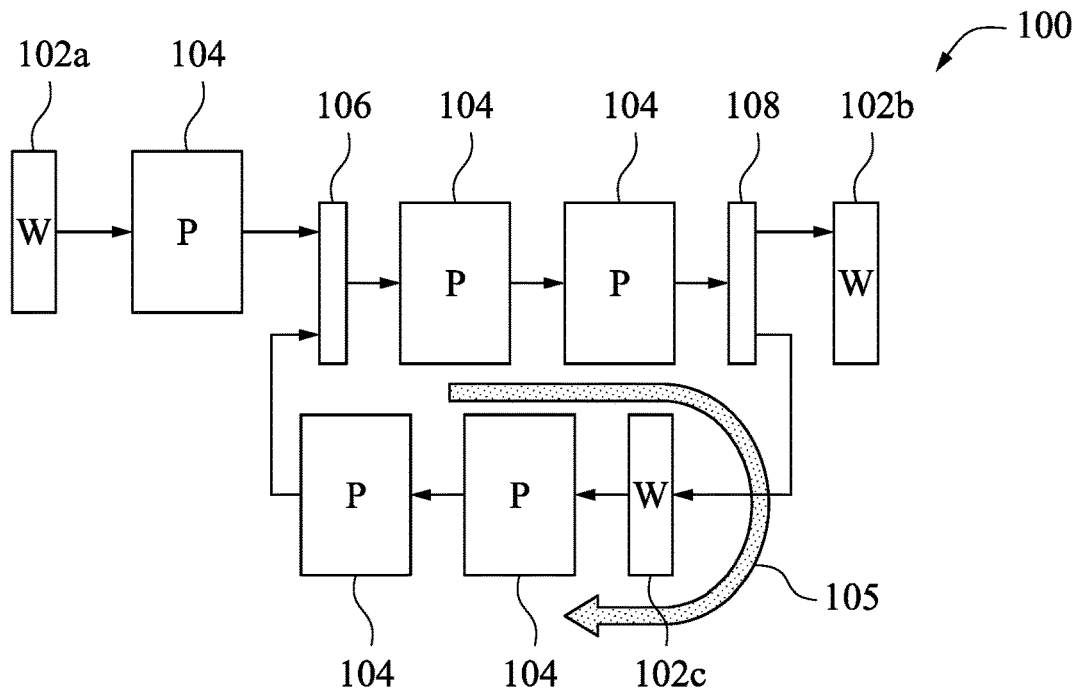
FIG. 1A is a schematic diagram illustrating a global feedback loop of an asynchronous cyclic pipeline circuit.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, the present disclosure provides asynchronous circuits, methods, and systems that may be utilized to test asynchronous circuits which may have one or more global or local feedback paths. Embodiments of the present disclosure facilitate testing of asynchronous circuits using conventional ATPG testing tools, which normally cannot sufficiently test such asynchronous circuits having global or local feedback paths. In some embodiments, asynchronous circuits may include Design-For-Test (DfT) features which facilitate testing of the asynchronous circuits by ATPG testing techniques.

Embodiments provided herein include ATPG modeling systems and methods which are operable to convert asynchronous circuit elements having one or more feedback loops into ATPG circuit models that do not include the feedback loops. Instead, feedback data which would normally be present in the feedback loops of the asynchronous circuit elements may be provided as input data to the ATPG circuit models.

Various embodiments of the present disclosure are described with respect to various asynchronous circuits, including asynchronous circuits which are well-known to those skilled in the relevant field, such as a weak conditioned half buffer (WCHB), a precharge half buffer (PCHB), and a precharge full buffer (PCFB). As noted in the background section, above, testing of asynchronous circuits can be more difficult than testing synchronous circuits for various reasons. One such reason is that many asynchronous circuits, such as PCHB and PCFB circuits, may include various levels of complicated feedback loops, which may include global feedback loops, as well as local feedback loops, which cannot be adequately handled by current testing methodologies, such as Automatic Test Pattern Generation (ATPG) techniques.

Figure 1B:
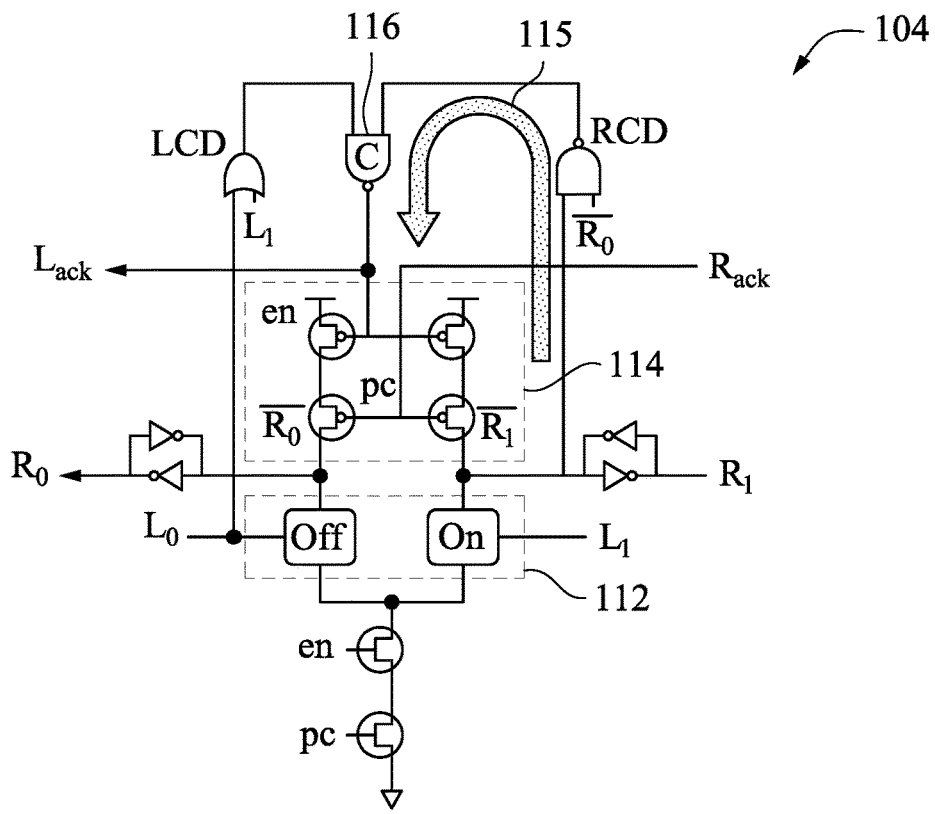
FIG. 1B is a circuit diagram showing further details of a precharge half buffer (PCHB) circuit of the asynchronous cyclic pipeline circuit shown in FIG. 1A.
Figure 1C:
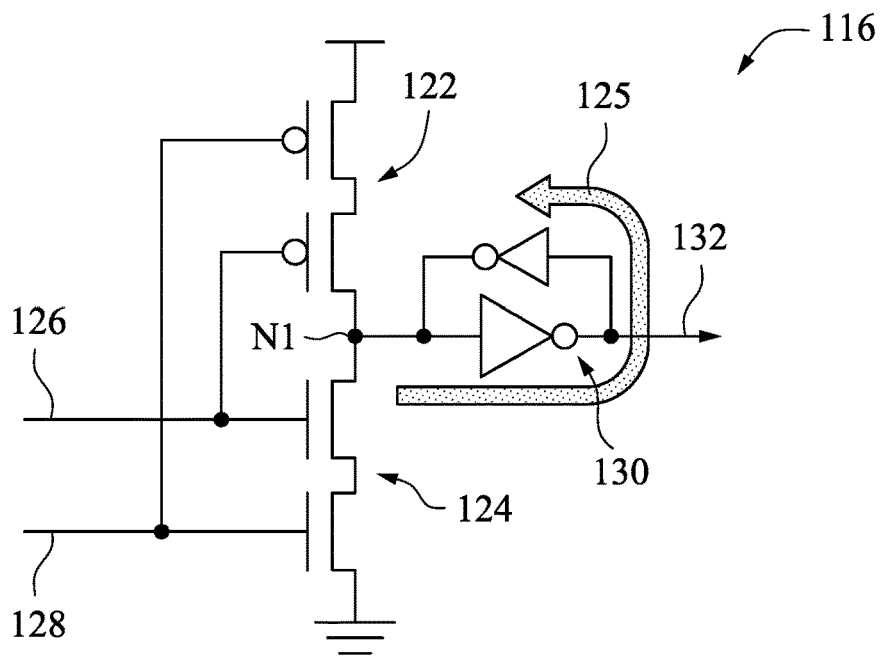
FIG. 1C is a circuit diagram showing further details of a C-element of the PCHB circuit shown in FIG. 1B.

FIGS. 1A to 1C are schematic illustrations showing different levels of feedback loops in various asynchronous circuits.

FIG. 1A is a schematic illustration of an asynchronous cyclic pipeline circuit 100. The circuit 100 includes a plurality of weak conditioned half buffers (WCHBs) 102 and a plurality of precharge half buffers (PCHBs) 104. WCHBs are often used as buffers in circuits which include PCHBs or precharge full buffers (PCFBs). In the example shown in FIG. 1A, the circuit 100 includes a first WCHB 102a at an input portion of the circuit 100, a second WCHB 102b at an output portion of the circuit 100, and a third WCHB 102c at an input of a feedback loop 105 of the circuit 100. PCHBs 104 may be arranged as shown in FIG. 1A. A merge element 106 may be included in the circuit, which may merge signals provided from the input portion with an output of the feedback loop 105 of the circuit 100. The merge element 106 may be, for example, an addition circuit element, subtraction circuit element, or any circuit element which merges, combines, or otherwise outputs a signal based on two or more input signals. A fork element 108 may be included in the circuit, which may output multiple signals along different paths based on an input signal. For example, as shown in FIG. 1A, the fork element 108 may receive an input signal from a PCHB 104, and may provide a first output to the second WCHB 102b at the output portion of the circuit 100 and may further provide a second output to the third WCHB 102c at the input of the feedback loop 105. The fork element 108 may be any circuit element that outputs multiple signals based on a common input signal. The feedback loop 105 may be referred to as a "global" feedback loop, as it is a feedback loop which is formed within an arrangement of a plurality of asynchronous circuit elements, such as the WCHBs 102 and PCHBs 104 as shown in FIG. 1A.

FIG. 1B is a circuit diagram showing further details of a PCHB circuit 104. The PCHB circuit 104 may generally be described as a dual-rail buffer circuit that stores dual-rail data. A dual-rail circuit has two rails for each input or output. For example, the PCHB circuit 104 has two rails for input ($L_0$ and $L_1$), and two rails for output ($R_0$ and $R_1$).

The PCHB circuit 104 further includes an input completion detector LCD, an output completion detector RCD, a logic evaluation block 112, a pre-charging circuit 114, an input acknowledgement node $L_{ack}$, and an output acknowledgement node $R_{ack}$.

The input completion detector LCD is coupled to the two input rails $L_0$, $L_1$. In the example configuration shown in FIG. 1B, the input completion detector LCD includes an OR gate. The output of the input completion detector LCD is coupled to a first input of a C-gate or C-element 116. While the input completion detector LCD is shown as being an OR gate, other configurations are possible and are within the scope of various embodiments.

The output completion detector RCD is coupled to the two output rails $R_0$, $R_1$. More particularly, in the example configuration shown in FIG. 1B, the output completion detector RCD is coupled to the inverted signals that are produced at the output rails $R_0$, $R_1$, so that the output completion detector RCD receives as input $\overline{R_0}$, $\overline{R_1}$. The output completion detector RCD includes a NAND gate. The output of the output completion detector RCD is coupled to a second input of the C-element 116. An output of the C-element 116 is coupled to the input acknowledgement node $L_{ack}$. While the output completion detector RCD is shown as being a NAND gate, other configurations are possible and are within the scope of various embodiments.

The C-element 116 is an example of an asynchronous data-storing circuit. In some embodiments, the C-element 116 changes an output state when the inputs have the same value, rather than in response to a clock. For example, the C-element 116 may be configured to switch its output when all the inputs match. For example, when all inputs of the C-element are at logical "0," the input acknowledgement $L_{ack}$ at the output of the C-element 116 is at logical "0." The C-element 116 maintains the input acknowledgement $L_{ack}$ at logical "0" until all inputs of the C-element 116 are at logical "1," at which time, the C-element 116 switches the input acknowledgement $L_{ack}$ to logical "1." Other configurations for generating the input acknowledgement $L_{ack}$ are within the scope of various embodiments.

The logic evaluation block 112 is configured to perform a logic function (also referred to herein as "logic evaluation") of input signals at the inputs $L_0$, $L_1$, and to output an output signal corresponding to a result of the logic evaluation at the output rails $R_0$, $R_1$. In the example shown in FIG. 1B, the logic evaluation block 112 may include two transistors, with one in an ON state and the other in an OFF state. Other configurations and/or logic functions of the logic evaluation block 112 are within the scope of various embodiments. Indeed, in various embodiments, the PCHB circuit 104, as well as any other asynchronous circuitry such as a PCFB circuit or the like, may include any combination of logical circuitry configured to perform any logical functions.

The pre-charging circuit 114 is configured to pre-charge the logic evaluation block 112 in response to the input acknowledgement $L_{ack}$ and the output acknowledgement $R_{ack}$. The input acknowledgement $L_{ack}$ may be a signal provided to a previous logic stage (e.g., a previous PCHB circuit, or the like), and the output acknowledgement $R_{ack}$ may be provided from a next logic stage. The output $R_0$, $R_1$ of the PCHB circuit 104 is coupled to an input of the next logic stage, and the output of the previous logic stage is coupled to the inputs $L_0$, $L_1$ of the PCHB circuit 104.

In the example configuration shown in FIG. 1B, the pre-charging circuit 114 includes four transistors, arranged in respective pairs that are coupled in series between a supply voltage (e.g., VDD) and one of the transistors of the logic evaluation block 112. However, the configuration of the pre-charging circuit 114 shown in FIG. 1B is provided as just one example, and various other configurations of the pre-charging circuit 114 are within the scope of various embodiments.

In operation, the PCHB circuit 104 implements a domino-logic protocol, where two control signals enable (en) and precharge (pc) are utilized for handshaking. Table I, below, illustrates the four-phase protocol.

TABLE 1

| Phase | en | pc | R+ |
|---|---|---|---|
| Precharge | 0 | 0 | Valid → Empty |
| Wait | 1 | 0 | Empty |
| Evaluation | 1 | 1 | Empty → Valid |
| Wait | 0 | 1 | Valid |

All of the PCHB circuit 104, except for the input completion detector LCD, the output completion detector RCD, the C-element 116, may be collectively referred to as "domino logic," which is implemented by the PCHB circuit 104. The logic evaluation block 112 may be referred to as "combinational logic," which is implemented by the PCHB circuit 104.

Referring now to Table 1, in the precharge phase, when both en and pc are zero, the next state of the dual rail outputs (collectively referred to as R+) falls to zero 00, representing a transition from a valid state to an empty state. In the evaluation phase, when both en and pc are 1, the output R+ reflects the correct result of evaluation, which is a valid state. In two wait phases, when en and pc are different, both upper and lower parts of the domino logic are open so the output R+ holds its previous value.

The pc control signal may be provided from the output acknowledgement $R_{ack}$ which is provided from the next logic stage. The input and output completion detectors, LCD and RCD, respectively check whether the dual-rail input and output data (L and R) are valid. When outputs of the input and output completion detectors LCD, RCD both are equal to logical "1", the input and output data are considered to be valid. The C-element 116, which may be an inverse C-element as shown, generates the en signal based on the outputs of the input and output completion detectors LCD, RCD. When en falls, both the input and output data are considered to be valid, and the PCHB circuit 104 may request the subsequent empty input from the previous logic stage. When en rises, both of the input and output data are considered to be empty, and the PCHB circuit 104 may request the subsequent valid input from the previous logic stage. The pc signal is essentially the same as the en signal, except that the pc signal is provided from, and represents a state of, the next logic stage.

Referring again to Table 1, when the PCHB circuit 104 enters the precharge phase, en=pc=0, so the PCHB circuit 104 will precharge and the output (R+) will become empty. Then en rises and the PCHB circuit 104 enters the next phase, waiting for pc to rise. When pc rises, which means the next logic stage is ready to accept new valid data, the PCHB circuit 104 enters the evaluation phase, where en=pc=1. New valid data coming from the previous logic stage will be evaluated by the PCHB circuit 104 and R+ will become valid. After en falls, the PCHB circuit 104 enters the second wait phase, in which the PCHB circuit 104 waits for pc to fall. When pc falls, which means the next logic stage is ready or empty, the PCHB circuit 104 can precharge again.

As shown in FIG. 1B, the PCHB circuit 104 includes an internal feedback loop 115, which is formed between inputs of the output completion detector RCD and the output of the C-element 116, and which generates a handshaking signal, e.g., the input acknowledgement $L_{ack}$. Additional feedback loops may be included within the PCHB circuit 104. The feedback loop 115 may be referred to herein as a "local" feedback loop, as it is a feedback loop which is formed within the PCHB circuit 104 itself. It will be readily appreciated that similar local feedback loops may be included in various other asynchronous circuit elements, such as PCFBs.

FIG. 1C is a circuit diagram showing further details of a C-element 116, such as the C-element 116 which may be included within the PCHB circuit 104, or within any other asynchronous circuit element, such as a PCFB. The C-element 116 shown in FIG. 1C is provided as just one example of a C-element which may be utilized in various embodiments of the present disclosure; however, various other configurations of C-elements are within the scope of the present disclosure.

As shown in FIG. 1C, the C-element 116 includes a first pair of transistors 122 and a second pair of transistors 124. A first input 126 is coupled to gate terminals of one of the first pair of transistors 122 and one of the second pair of transistors 124. A second input 128 is similarly coupled to gate terminals of one of the first pair of transistors 122 and one of the second pair of transistors 124. The first input 126 may be coupled, for example, to the output of the input completion detector LCD of the PCHB 104, while the second input 128 may be coupled, for example, to the output of the output completion detector RCD of the PCHB 104.

The first and second pairs of transistors 122, 124 may be arranged as a pull-up and pull-down network, as shown. A pair of cross-coupled inverters 130 is coupled between a node N1 and an output 132 of the C-element 116. The node N1 electrically connects the first pair of transistors 122 to the second pair of transistors 124.

As shown in FIG. 1C, the C-element 116 includes an internal feedback loop 125, which is formed by the cross-coupled inverters 130. Additional feedback loops may be included within the C-element 116. The feedback loop 125 represents a "local" feedback loop, as it is a feedback loop which is formed within the C-element 116, which is a part of the PCHB circuit 104. It will be readily appreciated that similar local feedback loops may be included in various other configurations of C-elements which are within the scope of the present disclosure.

As described above with respect to FIGS. 1A to 1C, asynchronous circuits, which may include a chain of asynchronous circuit elements (e.g., WCHBs, PCHBs, PCFBs), may include a plurality of different levels of feedback loops. For example, the asynchronous cyclic pipeline circuit 100 may include a "global" feedback loop, such as the feedback loop 105 formed by the arrangement of asynchronous circuit elements as shown in FIG. 1A. Additionally, the asynchronous cyclic pipeline circuit 100 may include a plurality of first "local" feedback loops. For example, each PCHB 104 within the asynchronous cyclic pipeline circuit 100 may include a respective feedback loop 115 which is internal to the PCHB 104. Further, the circuit 100 may include a plurality of second "local" feedback loops, which may be, for example, feedback loops 125 which are internal to a circuit element (e.g., a C-element) within an asynchronous circuit module (e.g., a PCHB). Thus, FIGS. 1A to 1C illustrate three different levels of feedback loops within the asynchronous cyclic pipeline circuit 100, and such different levels of feedback loops generally cannot be adequately tested by conventional Automatic Test Pattern Generation (ATPG) techniques.

In various embodiments, circuits and methods are provided which facilitate testing of the global and local feedback loops illustrated, for example, with respect to FIGS. 1A to 1C.

Figure 2:
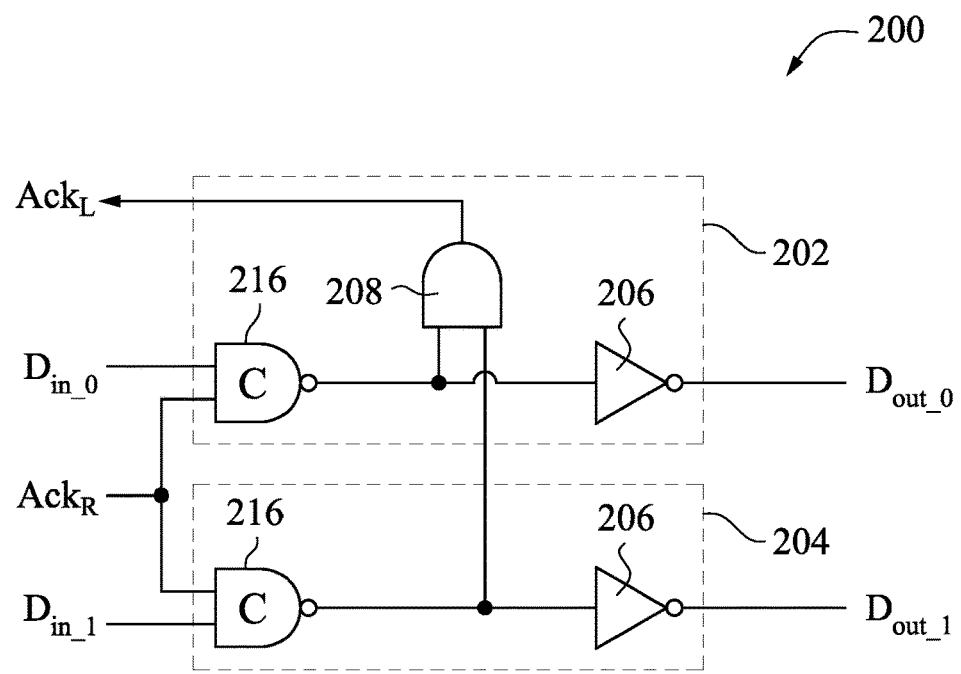
FIG. 2 is a schematic illustration of a weak conditioned half buffer (WCHB).
Figure 3:
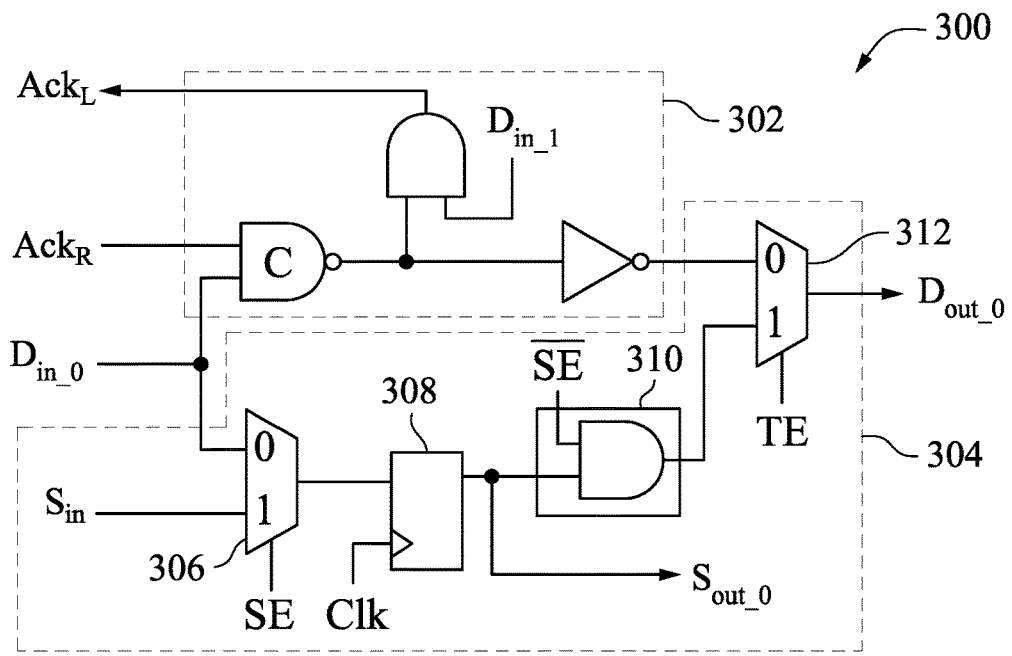
FIG. 3 is a schematic illustration of a Dual-rail Asynchronous Circuit Scan (DAC-scan) circuit, in accordance with some embodiments.

FIG. 2 is a schematic illustration of a weak conditioned half buffer (WCHB) 200, and FIG. 3 is a schematic illustration of a Dual-rail Asynchronous Circuit Scan (DAC-scan) circuit 300 which includes portions of the WCHB 200 and which includes Design-for-Test (DfT) features which facilitate testing of asynchronous circuits, for example, by ATPG, in accordance with one or more embodiments of the present disclosure.

Referring to FIG. 2, the WCHB 200 may be any WCHB circuit, including, for example, any conventional WCHB circuit. The WCHB 200 may be included in any asynchronous circuit chain, including, for example, the asynchronous pipeline circuit 100 shown in FIG. 1A. For example, the WCHB 200 may represent any of the first through third WCHBs 102a, 102b, 102c of the asynchronous pipeline circuit 100. In general, a WCHB circuit is an asynchronous circuit element which can be used to store data.

The WCHB 200 is a dual-rail WCHB circuit, and includes a first data path 202 and a second data path 204. Each of the first and second data paths 202, 204 receives a respective input data $D_{in\_0}$, $D_{in\_1}$ and outputs a respective output data $D_{out\_0}$, $D_{out\_1}$, as shown. Each of the first and second data paths 202, 204 includes a respective C-element 216 which receives as input a respective one of the input data $D_{in\_0}$, $D_{in\_1}$ and a first acknowledgement signal $Ack_R$, which is a handshake signal, such as, for example, the output acknowledgement $R_{ack}$ described previously herein. Additionally, each of the first and second data paths 202, 204 includes a respective inverter 206 coupled between a respective one of the C-elements 216 and a respective one of the outputs $D_{out\_0}$, $D_{out\_1}$.

The first data path 202 may further include an AND gate 208 which is used to generate a second acknowledgement signal $Ack_L$, which is another handshake signal, such as, for example, the input acknowledgement $L_{ack}$ previously described herein. The AND gate 208 may receive as input the outputs of the C-elements 216 included in the first and second data paths 202, 204.

Referring now to FIG. 3, the DAC-scan circuit 300 is an asynchronous scannable circuit element which includes DfT features that facilitate independent control of various global feedback loops which may be included in an asynchronous circuit in which one or more DAC-scan circuits 300 are included. This will be discussed in further detail with respect to FIG. 5.

The DAC-scan circuit 300 includes a data path 302, which may be substantially the same as the first data path 202 of the WCHB 200 shown and described with respect to FIG. 2. The DAC-scan circuit 300 further includes a scan path 304. During normal operation, the data path 302 allows data to flow through the DAC-scan circuit 300. The scan path 304 is used during testing of an asynchronous circuit which includes the DAC-scan circuit 300. For example, the scan path 304 may be used to inject test values of a scan pattern into the DAC-scan circuit 300, which may allow for testing of the DAC-scan circuit 300 itself, as well as testing of other circuits to which the DAC-scan circuit 300 is coupled.

The scan path 304 of the DAC-scan circuit 300 includes a first multiplexer 306, a latch 308, a scan isolator 310, and a second multiplexer 312. The second multiplexer 312 may have a first input coupled to an output of the data path 302, and a second input coupled to an output of the scan isolator 310, as shown. The path select multiplexer 312 selects one of the inputs based on a test enable signal TE, and outputs the selected input as the output $D_{out\_0}$. The second multiplexer 312 therefore selects one of the data path 302 or the scan path 304 for providing an output, and the selection of the data path 302 or the scan path 304 depends on a mode of operation of the DAC-scan circuit 300. For example, during normal operation, the test enable signal TE causes the second multiplexer 312 to select the data path 302 for output, and the second multiplexer 312 couples the output of the data path 302 to the output $D_{out\_0}$ of the DAC-scan circuit 300. The second multiplexer 312 may be an asynchronous or a synchronous multiplexer.

The scan path 304 of the DAC-scan circuit 300 includes a scan input $S_{in}$, which may receive a scan pattern and inject values of the scan pattern into a flow of data. The scan input $S_{in}$ is coupled to a first input of the first multiplexer 306. The first multiplexer 306 may be an asynchronous or a synchronous multiplexer. The first multiplexer 306 is controlled by a scan enable signal SE, which selects either the input data $D_{in\_0}$ or the scan input $S_{in}$ to be output by the first multiplexer 306 and provided to the latch 308.

The latch 308 may be, for example, a D flip-flop. The latch 308 includes a clock input that receives a clock signal Clk for controlling timing of operations of the latch 308. The latch 308 may store a value of the scan pattern to inject into the flow of data via the second multiplexer 312. In some embodiments, the latch 308 is coupled to an input of the second multiplexer 312 by the scan isolator 310.

A scan output $S_{out\_0}$ is provided between an output of the latch 308 and an input of the scan isolator 310. The scan isolator may be implemented with any circuitry, e.g., digital logic circuitry, which is configured to block the output (e.g., the data output $D_{out\_0}$) during the shifting of the scan chain, as will be described in further detail herein. In some embodiments, the scan isolator 310 may be an AND gate which receives an inverted scan enable signal $\overline{SE}$ at a first input and receives an output of the latch 308 (e.g., the scan output $S_{out\_0}$) at a second input. The output of the scan isolator 310 is provided as an input to the second multiplexer 312.

The DAC-scan circuit 300 is illustrated as including only one data path 302 for convenience of description. It will be readily appreciated that the DAC-scan circuit 300 may include two data paths. For example, as shown in FIG. 2, a WCHB circuit 200 may be a dual-rail circuit which includes two data paths 202, 204, each of which receives a respective input data $D_{in\_0}$, $D_{in\_1}$ and outputs a respective output data $D_{out\_0}$, $D_{out\_1}$. While the DAC-scan circuit 300 is illustrated as including only a data path for $D_0$ (e.g., input data $D_{in\_0}$, and output data $D_{out\_0}$), it will be readily appreciated that the DAC-scan circuit 300 may include a second data path for a second rail of the dual-rail data (e.g., input data $D_{in\_1}$, and output data $D_{out\_1}$). In such embodiments, the DAC-scan circuit 300 may include a second data path which is substantially the same as, or identical to, the data path 302 (except that is receives input data $D_{in\_1}$, and outputs output data $D_{out\_1}$), and further may include a second scan path that is connected to the second data path and which is substantially the same as, or identical to, the scan path 304.

Figure 4A:
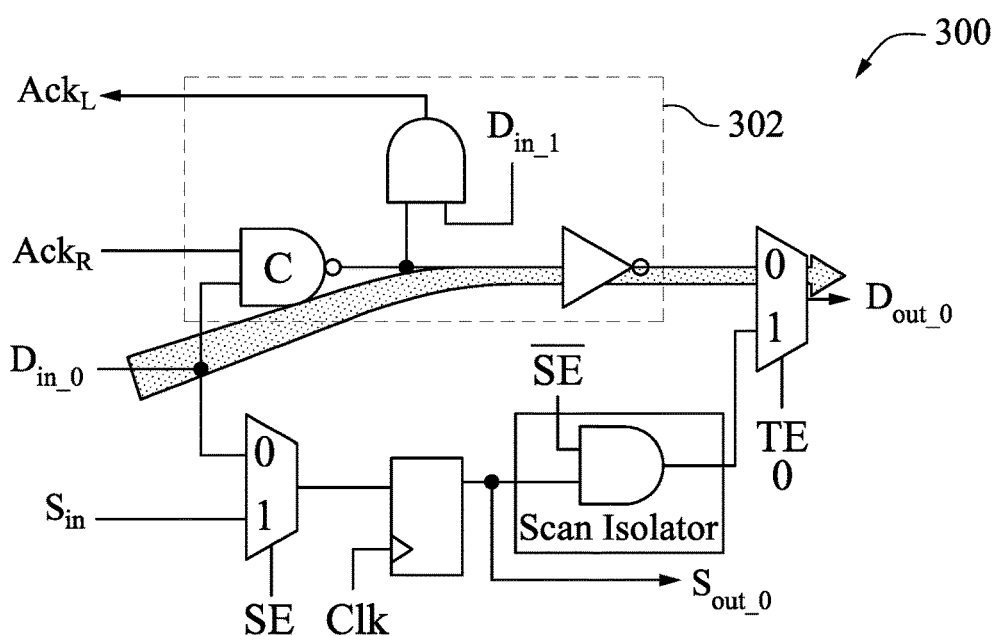
FIG. 4A is a schematic diagram illustrating operation of the DAC-scan circuit shown in FIG. 3 in a normal mode of operation, in accordance with some embodiments.
Figure 4B:
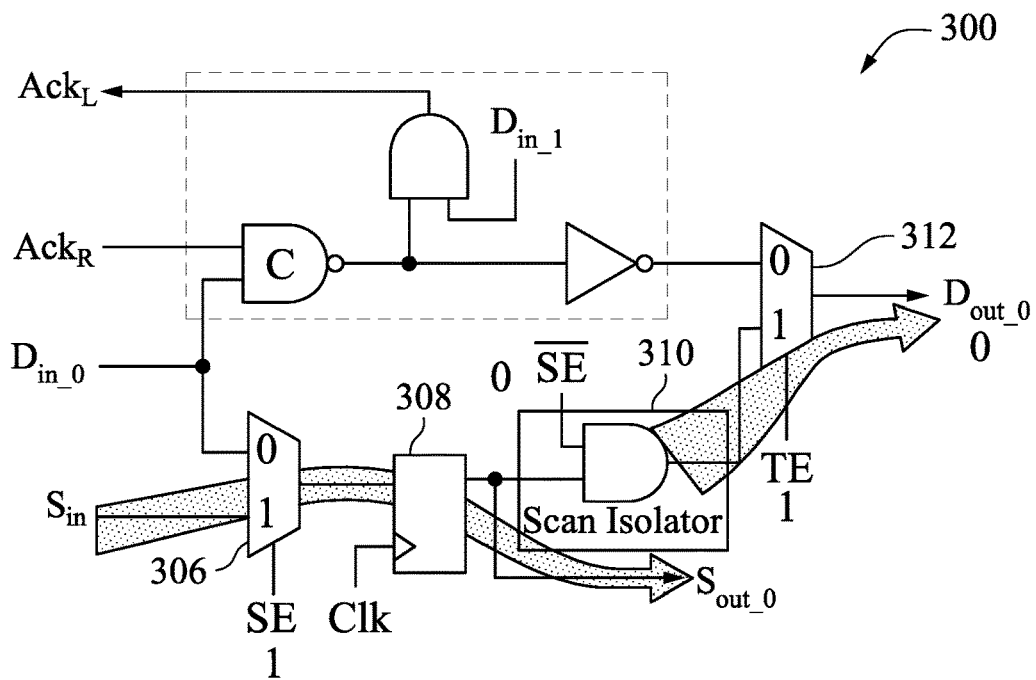
FIG. 4B is a schematic diagram illustrating operation of the DAC-scan circuit shown in FIG. 3 in a shift mode of operation, in accordance with some embodiments.
Figure 4C:
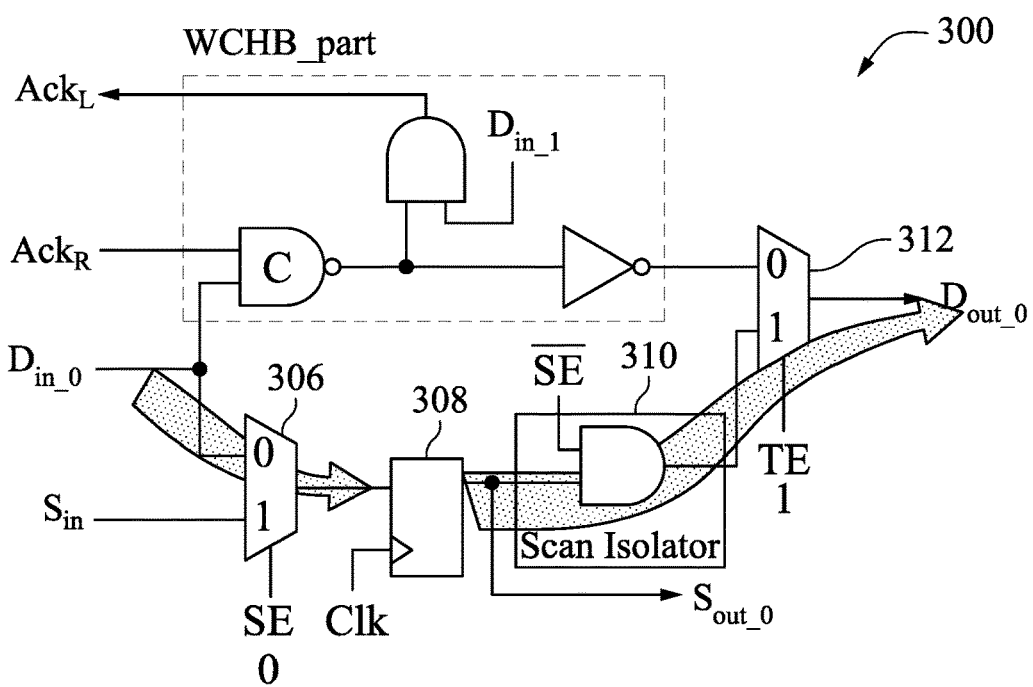
FIG. 4C is a schematic diagram illustrating operation of the DAC-scan circuit shown in FIG. 3 in a test mode of operation, in accordance with some embodiments.

The DAC-scan circuit 300 may operate in a normal mode, a shift mode, and a test mode. FIGS. 4A through 4C schematically illustrate operation of the DAC-scan circuit 300 in the normal mode, the shift mode, and the test mode, respectively.

FIG. 4A is a schematic diagram illustrating operation of the DAC-scan circuit 300 in the normal mode of operation. As previously mentioned, the data path 302 is selected during the normal mode so that data flows through the DAC-scan circuit 300 along the data path 302. More particularly, in the normal mode, the test enable signal TE signal is low (e.g., 0), and data travels through the data path 302 (e.g., the WCHB circuit portion of the DAC-scan circuit 300), from the data input $D_{in\_0}$ to the data output $D_{out\_0}$.

FIG. 4B is a schematic diagram illustrating operation of the DAC-scan circuit 300 in the shift mode of operation. In the shift mode, both the test enable signal TE and the scan enable signal SE are high (e.g., 1). In the shift mode, test patterns may be shifted through the scan chain from the scan input $S_{in}$ to the scan output $S_{out\_0}$, which may be synchronously controlled by the clock signal Clk. For example, the shifting of the test patterns in the shift mode may be controlled by pulsing of the clock signal Clk. A scan chain may include a plurality of asynchronous circuit elements, such as any of the circuit elements of the asynchronous cyclic pipeline circuit 100 shown in FIG. 1A. The various circuit elements may be coupled together (e.g., in a daisy chain configuration) by coupling a scan output $S_{out\_0}$ of one circuit element (e.g., a DAC-scan circuit 300) to a scan input of a next circuit element in the chain. The scan isolator blocks the output (e.g., to the data output $D_{out\_0}$) during the shifting of the scan chain.

In more detail, during the shift mode of operation the DAC-scan circuit 300 receives a value of a scan pattern at the scan input $S_{in}$, and the scan enable signal SE causes the first multiplexer 306 to select the scan input $S_{in}$ and output the value of the scan input $S_{in}$ to the latch 308. The value is captured by the latch 308 when the clock signal Clk is pulsed. Similarly, the previous value of the test pattern which was previously stored in the latch 308 is shifted out of the latch 308 and provided as the scan output $S_{out\_0}$ due to pulsing of the clock signal Clk.

During the shift mode of operation, the inverted scan enable signal $\overline{SE}$ is low (e.g., 0). Accordingly, the output of the scan isolator 310 is also low, and the value of the data output $D_{out\_0}$ is 0, as shown. Therefore, during the shift mode of operation, test patterns may be shifted through the scan chain, while providing a 0 level data output $D_{out\_0}$ to a next asynchronous circuit element (e.g., a PCHB, PCFB, etc.). This enables isolation of global feedback loops during testing of an asynchronous circuit, as will be described in further detail with respect to FIG. 5.

FIG. 4C is a schematic diagram illustrating operation of the DAC-scan circuit 300 in the test mode of operation. In the test mode, the test enable signal TE is high (e.g., 1) and the scan enable signal SE is low (e.g., 0), and a test pattern stored in the latch 308 may be applied through the scan isolator 310 and the second multiplexer 312 to the data output $D_{out\_0}$, which may then be applied, for example, to a next logic block, such as a next asynchronous circuit element (e.g., a PCHB, PCFB, etc.).

In more detail, during the test mode of operation the test enable signal TE causes the second multiplexer 312 to provide the value stored in the latch 308, which is passed through the scan isolator 310, as the data output $D_{out\_0}$ which may be passed to a downstream circuit element. During the test mode, the scan enable signal SE (e.g., at a low level, or 0) causes the first multiplexer 306 to select the data input $D_{in\_0}$, which is passed to the latch 308. The latch 308 stores the received value from the data input $D_{in\_0}$ when the clock signal CLK is pulsed.

Figure 5:
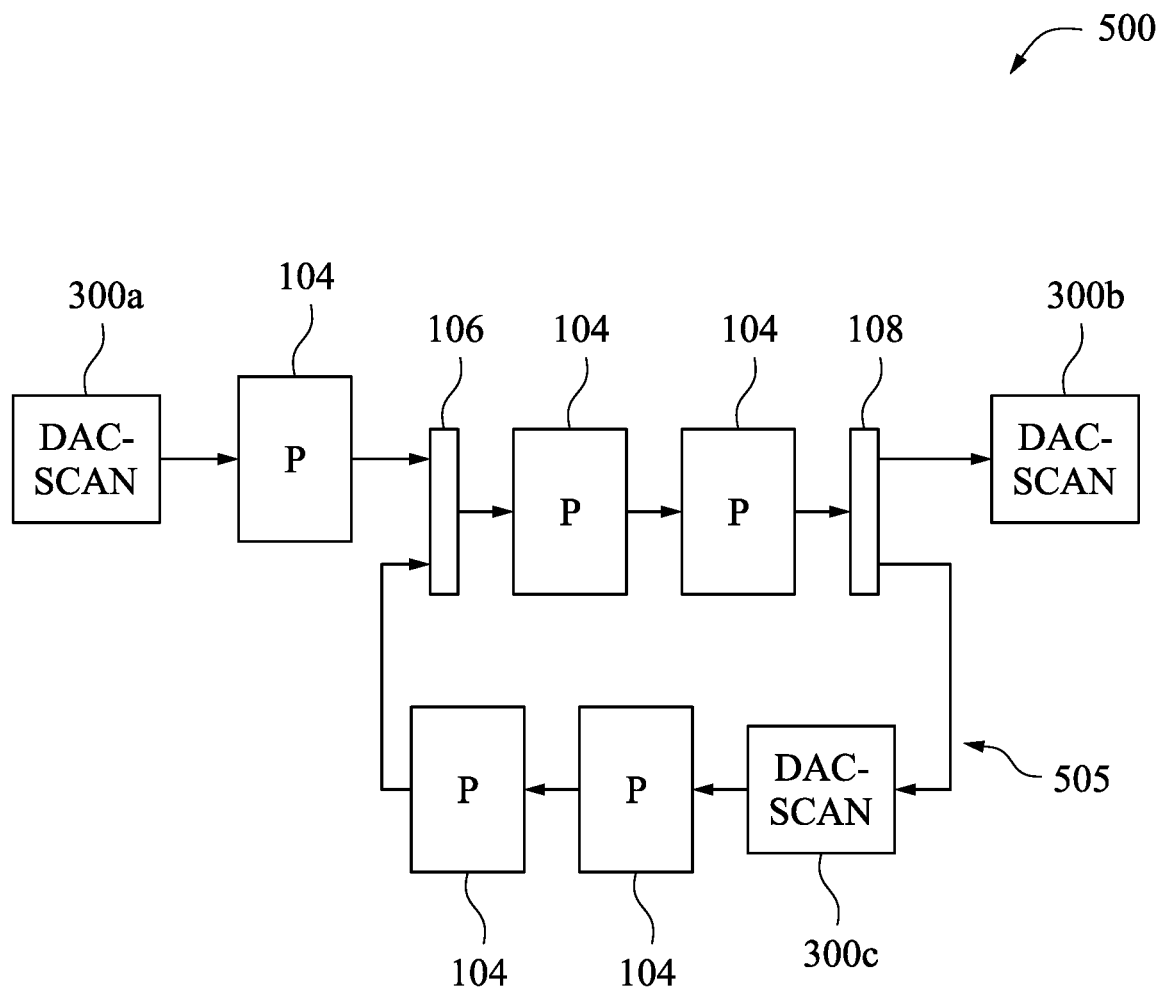
FIG. 5 is a schematic illustration of an asynchronous cyclic pipeline circuit, in accordance with some embodiments.

FIG. 5 is a schematic illustration of an asynchronous cyclic pipeline circuit 500, in accordance with one or more embodiments of the present disclosure. The asynchronous cyclic pipeline circuit 500 shown in FIG. 5 may be substantially the same as the asynchronous cyclic pipeline circuit 100 shown in FIG. 1A, except for the differences discussed below.

The asynchronous cyclic pipeline circuit 500 includes a plurality of PCHBs 104, which may be substantially the same as, or identical to, the PCHBs 104 shown in FIG. 1A. Similarly, the asynchronous cyclic pipeline circuit 500 includes a merge element 106 and a fork element 108, which may be substantially the same as, or identical to, the merge element 106 and fork element 108 shown in FIG. 1A.

The difference between the asynchronous cyclic pipeline circuit 500 of FIG. 5 and the asynchronous cyclic pipeline circuit 100 of FIG. 1A is that, in the asynchronous cyclic pipeline circuit 500 of FIG. 5, the WCHBs are replaced with the DAC-scan circuits 300. The DAC-scan circuits 300 may be substantially the same as, or identical to, the DAC-scan circuit 300 shown and described with respect to FIG. 3. In some embodiments, each of the DAC-scan circuits 300 of the asynchronous cyclic pipeline circuit 500 are dual-rail DAC-scan circuits 300 which receive dual-rail input data $D_{in\_0}$, $D_{in\_1}$ and which output dual-rail output data $D_{out\_0}$, $D_{out\_1}$. For example, as previously described, the DAC-scan circuits 300 may include first and second data paths and first and second scan paths.

In the example asynchronous cyclic pipeline circuit 500 shown in FIG. 5, a first DAC-scan 300a is located at an input portion of the asynchronous cyclic pipeline circuit 500, a second DAC-scan 300b is located at an output portion of the asynchronous cyclic pipeline circuit 500, and a third DAC-scan 300c is located at an input of the feedback loop of the asynchronous cyclic pipeline circuit 500.

Due to the DfT features of the DAC-scan circuits 300, the asynchronous cyclic pipeline circuit 500 can be tested, without complications arising from the inclusion of a feedback loop 505. More particularly, the feedback loop 505 can be selectively turned on or off during testing of the asynchronous cyclic pipeline circuit 500 so that each separate branch or path of the asynchronous cyclic pipeline circuit 500 can be selectively tested and analyzed. This is possible due to the different modes of operations of the DAC-scan circuits 300 as described, for example, with respect to FIGS. 4A to 4C. The DAC-scan circuits 300 enable independent control of the various circuit branches of the asynchronous cyclic pipeline circuit 500, which facilitates selective isolation of global feedback loops during testing.

In some embodiments, the asynchronous cyclic pipeline circuit 500 may be a physical circuit, and the DAC-scan circuits 300 may similarly be physical circuits which are formed, for example, on a semiconductor device or chip. In some embodiments, the DAC-scan circuits 300 may be circuit element models which may be stored, for example, in a circuit model library which is accessed during a design stage in which a semiconductor device or chip or the like may be designed and modeled. For example, the DAC-scan circuits 300 may be stored in a model library database or the like which may be accessed by an electronic design automation tool during a design phase of a semiconductor device. The DAC-scan circuits 300 may be utilized in such a design phase in place of WCHB circuits, as the DAC-scan circuits 300 include the DfT features discussed herein which facilitate testing of circuitry including one or more global feedback loops, such as the asynchronous cyclic pipeline circuit 500.

The local feedback loops of the asynchronous cyclic pipeline circuit 500, such as the feedback loops within each PCHB circuit or PCHB circuit module, may be handled or evaluated in various embodiments of the present disclosure by modeling of the PCHB circuit for ATPG testing. In various embodiments, the present disclosure provides ATPG modeling for a PCHB circuit, as well as for any other asynchronous circuit element (such as a PCFB circuit element), for analyzing local feedback loops such as the feedback loop 115 which is internal to the PCHB, as shown in FIG. 1B, and the feedback loops 125 which are internal to a C-element of a PCHB, as shown in FIG. 1C. Such ATPG modeling will be described in further detail with respect to FIGS. 6 to 9.

Figure 6:
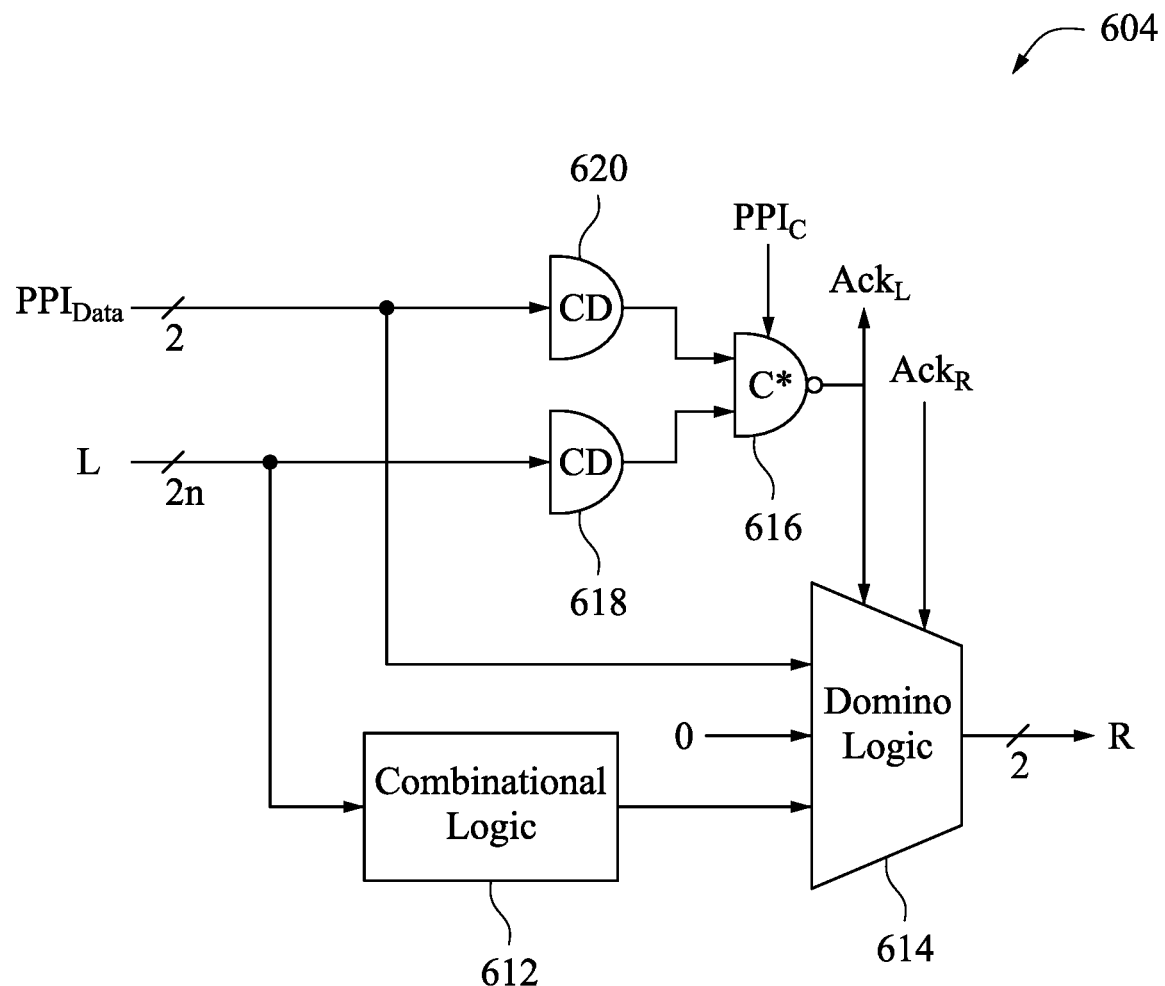
FIG. 6 is a schematic diagram illustrating an Automatic Test Pattern Generation (ATPG) PCHB circuit model, in accordance with some embodiments.

FIG. 6 is a schematic diagram illustrating a PCHB circuit model 604 which may be an ATPG circuit model for a PCHB circuit, such as the PCHB circuit 104 previously described herein. The PCHB circuit model 604 may be an equivalent gate level model of the PCHB circuit 104. Conventional ATPG testing techniques cannot sufficiently analyze a PCHB circuit, as PCHB circuits are too complicated and include local feedback loops as previously discussed herein. In particular, conventional ATPG testing techniques typically only generate test patterns to test logic gates (e.g., AND, NOR, etc.). Accordingly, in embodiments of the present disclosure, the PCHB transistor-level circuit (e.g., PCHB circuit 104) is transformed into an equivalent gate-level PCHB circuit model 604 so that ATPG test generation techniques can be utilized to generate adequate test patterns to sufficiently test the various feedback loops in a PCHB circuit.

As shown in FIG. 6, the PCHB model 604 includes combinational logic 612, domino logic 614, a C* element 616, a first completion detector 618, and a second completion detector 620.

Input data L is input to the first completion detector 618 and to the combinational logic 612. The input data L may be dual-rail data, as the PCHB model 604 may represent a dual-rail PCHB circuit, such as the PCHB circuit 104 previously described herein. For example, the input data L may represent the dual-rail input data $L_0$ and $L_1$. As can be seen by comparison with the PCHB circuit 104 shown in FIG. 1B, the first completion detector 618 may substantially correspond to the input completion detector LCD of the PCHB circuit 104, as the first completion detector 618 receives two rails of the input data L (e.g., $L_0$ and $L_1$). The second completion detector 620 may substantially correspond to the output completion detector RCD of the PCHB circuit 104, as the second completion detector 620 receives feedback data as input. The feedback data in the PCHB model 604 is represented by $PPI_{Data}$, which represents local feedback data of the PCHB circuit 104, for example, feedback data which propagates through the feedback loop 115.

The C* element 616 represents a modified version of the C-element 116 of the PCHB circuit 104, and the C* element 616 receives as input the outputs of the first and second completion detectors 618, 620. The C* element 616 receives an additional input $PPI_C$, which is control input data that models the memory of the C-element 116. That is, the additional input $PPI_C$ models a held state of the C-element 116, which is provided through the feedback loop 125 as shown in FIG. 1C. Like the C-element 116 of the PCHB circuit 104, the C* element 616 of the PCHB model 604 generates and outputs a first acknowledgement signal $Ack_L$, which may substantially correspond to the input acknowledgement $L_{ack}$. A second acknowledgement signal $Ack_R$ is provided as input to the domino logic 614, and the second acknowledgement signal $Ack_R$ may substantially correspond to the output acknowledgement $R_{ack}$ of the PCHB circuit 104, which may be received, for example, from a next logic stage. The first acknowledgement signal $Ack_L$ may also be the enable signal en, as in the PCHB circuit 104. Similarly, the second acknowledgement signal $Ack_R$ may also be the precharge signal pc, as in the PCHB circuit 104. Thus, the domino logic 614 receives the enable signal en and the precharge signal pc as inputs. The enable signal en and the precharge signal pc are control signals for controlling operation of the PCHB model 604.

The domino logic 614 further receives as input the $PPI_{Data}$ and an output of the combinational logic 612. An additional input of the domino logic 614 may receive a low level (e.g., 0) signal. The domino logic 614 provides as output the output data R, which may be dual-rail output data, such as the dual-rail outputs $R_0$, $R_1$ of the PCHB circuit 104.

The combinational logic 612 may substantially correspond to the logic evaluation block 112 of the PCHB circuit 104, and may generally include any combination of logical circuitry configured to perform or implement any logical functions. The combinational logic 612 replaces the elements of the logic evaluation block 112 (e.g., the ON/OFF logic) with their equivalent gate-level circuitry.

The domino logic 614 may substantially correspond to all of the remaining circuitry of the PCHB circuit 104, except for the input completion detector LCD, the output completion detector RCD, the C-element 116, and the logical evaluation block 112. The domino logic 614 includes control logic to control the 4-phase handshake protocol of the PCHB circuit 104, for example, described previously herein with respect to Table 1. The domino logic 614 may be modeled as a multiplexer, as shown in FIG. 6.

Figure 7:
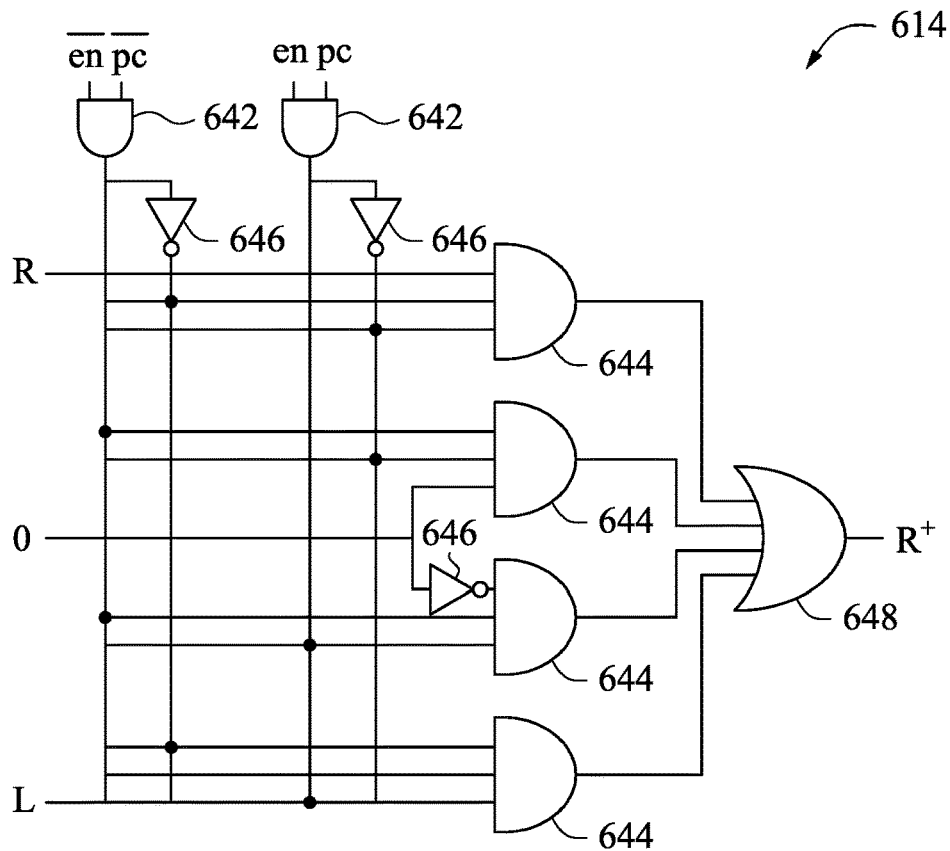
FIG. 7 is a circuit diagram illustrating further details of a domino logic portion of the ATPG PCHB circuit model of FIG. 6, in accordance with some embodiments.

FIG. 7 is a circuit diagram illustrating further details of the domino logic 614. In particular, the domino logic 614 is modeled by gate-level logic elements. For example, as shown in FIG. 7, the domino logic 614 may include a plurality of two-input AND gates 642, a plurality of three input AND gates 644, a plurality of inverters 646, and an OR gate 648. The OR gate 648 may be a four-input OR gate which receives as input the outputs from each of the three-input AND gates 644. The OR gate 648 may output the output data R (shown in FIG. 7 as output data $R^+$), which may be dual-rail output data, such as the dual-rail outputs $R_0$, $R_1$.

The domino logic 614 shown in FIG. 7 is provided as only an example of gate-level logic elements which can be used to model the domino logic of a PCHB circuit. It will be readily appreciated that in various embodiments, the domino logic of a PCHB circuit may have various different configurations, and therefore the domino logic 614 of the PCHB model 604 may have various different gate-level logic elements in various different configurations. The domino logic 614, modeled as gate-level logic, emulates the operation of the PCHB circuit 104 in a way that is compatible with ATPG testing, since ATPG testing can only generate test patterns to test logic gates.

Figure 8:
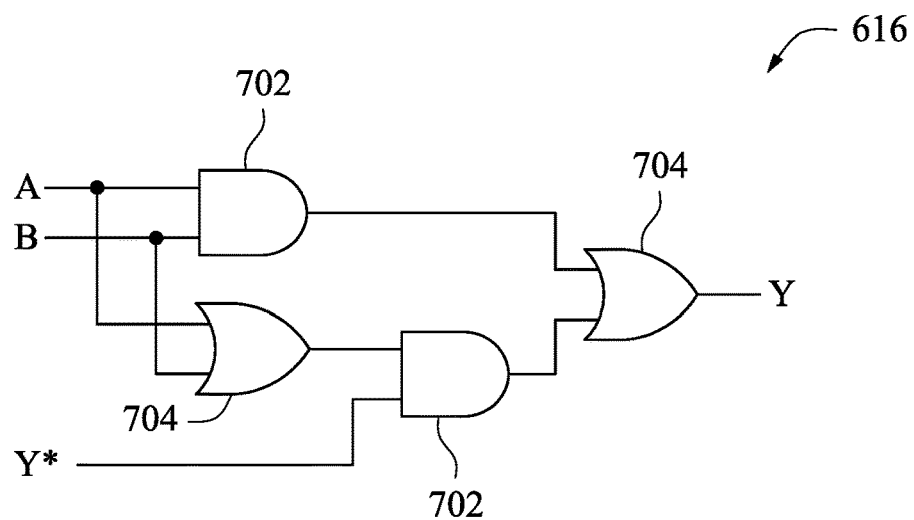
FIG. 8 is a circuit diagram illustrating further details of a C* element of the ATPG PCHB circuit model of FIG. 6, in accordance with some embodiments.

FIG. 8 is a circuit diagram illustrating further details of the C* element 616. More particularly, the circuit diagram of FIG. 8 provides a model of the C* element 616 with gate-level logic elements. ATPG testing is generally not suitable for testing sequential elements, such as C-elements, which are sequential components with local feedback loops. One reason for this, as previously discussed for example with respect to FIG. 1C, is due to the present of the feedback loop in C-elements. Thus, the C-element of the PCHB circuit 104 is replaced with, or modeled as, the C* element 616 with gate-level logic elements, as shown in FIG. 8, so that ATPG testing can adequately test the PCHB circuit 104, as modeled by the PCHB model 604 which includes the C* element 616.

The C* element 616 may include two AND gates 702 and two OR gates 704, as shown in FIG. 8. The C* element 616 receives a first input A and a second input B. The first and second inputs A, B may represent, for example, the outputs of the first and second completion detectors 618, 620 of the PCHB model 604 shown in FIG. 6. An additional input Y* is added to gate-level mode of the C* element 616, and the additional input Y* represents the current state of the C* element 616, e.g., a held state of the C* element 616. Meanwhile, the output Y represents an output of the C* element 616, or a next state of the C* element 616. Thus, the local feedback loop 125 of the C-element 116 of the PCHB circuit 104, as previously described with respect to FIG. 1C, is removed from the C* element 616, so that the sequential circuit is replaced by a combinational model which can be adequately tested by ATPG testing techniques.

The C* element 616 shown in FIG. 8 is provided as only an example of gate-level logic elements which can be used to model the C-element of a PCHB circuit. It will be readily appreciated that in various embodiments, the C-element of a PCHB circuit may have various different configurations, and therefore the C* element 616 of the PCHB model 604 may have various different gate-level logic elements in various different configurations.

Figure 9:
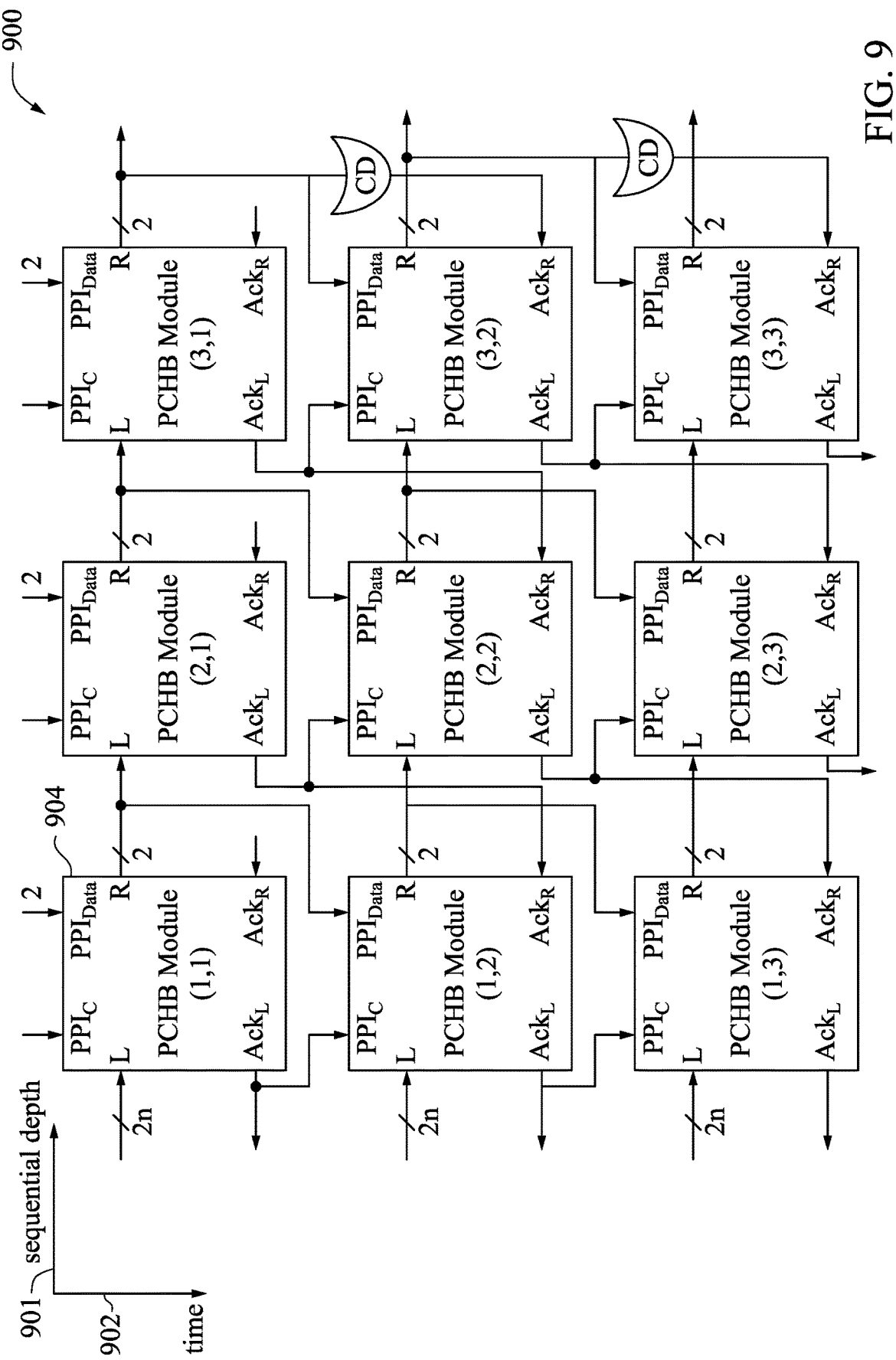
FIG. 9 is a schematic diagram illustrating a timeframe expansion ATPG model of a plurality of PCHB modules, in accordance with some embodiments.

FIG. 9 is a schematic diagram illustrating a timeframe expansion ATPG model 900 of a plurality of PCHB modules 904. Each of the PCHB modules 904 may be, for example, modeled by a PCHB circuit model such as the PCHB model 604 shown in FIG. 6. For example, each of the PCHB modules 904 may include domino logic 614 which is modeled by equivalent gate-level logic elements as shown in FIG. 7, and may include a C* element 616 which is modeled by gate-level logic elements as shown in FIG. 8. Moreover, each of the PCHB modules 904 may receive as inputs data or signals as shown at $PPI_{Data}$, $PPI_C$, L, and $Ack_R$, and each of the PCHB modules 904 may output data or signals as shown at R and $Ack_L$. Each of the input and output data or signals are the same as shown with respect to FIG. 6 and previously described herein.

The timeframe expansion ATPG model 900 is implemented in order to handle local feedbacks, for example, so that ATPG testing can sufficiently test the various local feedback loops which may be included within the physical circuitry that implements the asynchronous circuit element (e.g., the PCHB circuit 104). The timeframe expansion ATPG model 900 may have any number of PCHB modules 904, and may represent asynchronous circuits, such as the asynchronous cyclic pipeline circuit 500 shown in FIG. 5, having any number of asynchronous circuit elements (e.g., PCHB, PCFB, etc.).

In the example shown in FIG. 9, the timeframe expansion ATPG model 900 is an ATPG model which represents three PCHB circuits. In this example, an original circuit-under-test (CUT) (which may be a physical circuit to be tested) includes three PCHB circuits arranged in a chain. The ATPG model 900 may be generated in order to test the circuit-under-test in a way which can be handled by an ATPG testing tool or technique, and in a manner which accounts for the various feedback loops within the PCHB circuits.

The ATPG model 900 converts the three PCHB circuits into a 3×3 array of the PCHB modules 904. Each PCHB module 904 is indexed by (i, j), where row i represents the ith time frame, and column j represents the jth module. Each of the three columns of the array of PCHB modules 904 represents a separate one of the three PCHB circuits which are being modeled. For example, the columns may represent the sequential scan chain of the PCHB circuits. This is indicated as a "sequential depth" axis 901. Along the sequential depth axis 901, each of the PCHB modules of a row is different one from another. For example, in the first row, the PCHB module (1,1), the PCHB module (2,1), and the PCHB module (3,1) are all different from one another, and each one represents functionality of a separate one of the three PCHB circuits being modeled by the ATPG model 900. Thus, the sequential depth axis 901 represents a data flow, for example, from one of the PCHB circuits being modeled to a next of the PCHB circuits being modeled.

The "time" axis 902 represents a time direction. For example, the first row of the PCHB modules 904 may represent behavior of the circuit at a first time to, the second row may represent behavior of the circuit at second time $t_1$, and the third row may represent behavior of the circuit at a third time $t_3$. The increment of time between the first, second, and third times may be set at any value, depending on design specifications, particular designed timings of the circuit-under-test, or the like. Each of the PCHB modules 904 in a same column are the same as one another, but represent the behavior of the PCHB circuit represented by the particular column at different times. For example, in the first column, the PCHB module (1,1), the PCHB module (1,2), and the PCHB module (1,3) are all the same as one another, and each one represents functionality of a same one of the three PCHB circuits being modeled by the ATPG model 900 at different points in time.

Each of the PCHB modules 904 may receive as inputs data or signals as shown at $PPI_{Data}$, $PPI_C$, L, and $Ack_R$, and each of the PCHB modules 904 may output data or signals as shown at R and $Ack_L$. These signals are the same as previously described, for example, with respect to the PCHB model 604 shown in FIG. 6. Input $PPI_{Data}$ represents local feedback data of each of the three PCHB circuits being modeled, for example, the feedback data through feedback loop 115 described with respect to FIG. 1B. $PPI_C$ represents control input data that models the memory of the C-element within each of the three PCHB circuits being modeled, for example, as represented by feedback through the feedback loop 125 as shown in FIG. 1C.

Input $PPI_{Data}$ of PCHB module (i, j) is provided from the output R of a previous time frame of the same PCHB circuit being modeled, e.g., as represented by PCHB module (i−1, j). For example, as previously described, the PCHB modules 904 of a same column (j) are the same as one another and collectively represent a same PCHB circuit of the three PCHB circuits that are being modeled. The output R of the PCHB module (1,1) is provided as $PPI_{Data}$ input to the next PCHB module 904 of the same column, i.e., to PCHB module (1,2).

Similarly, input $PPI_C$ of PCHB module (i, j) is provided from $Ack_L$ of a previous time frame of the same PCHB circuit being modeled, e.g., as represented by PCHB module (i−1, j). For example, the output signal $Ack_L$ of the PCHB module (1,1) is provided as $PPI_C$ input to the next PCHB module 904 of the same column, i.e., to PCHB module (1,2).

Input $Ack_R$ of PCHB module (i, j) is provided from the output $Ack_L$ of previous time frame of the next PCHB circuit of the three PCHB circuits being modeled, e.g., as represented by PCHB module (i−1, j+1). For example, the output signal $Ack_L$ of the PCHB module (2,1) is provided as $Ack_R$ input to the PCHB module (1,2).

Initial values of $PPI_{Data}$, $PPI_C$, and $Ack_R$ of each of the PCHB modules 904 of the first timeframe (e.g., PCHB Modules (1,1), (2,1), and (3,1)) are set to zero because scan isolators may ensure that initial value of all feedback loops are zero.

The timeframe expansion ATPG model 900 thus may convert a sequential asynchronous circuit chain (e.g., as encountered by sequential chains of PCHB circuits), which cannot be adequately tested by ATPG testing techniques, into a combinational pattern, so that multiple-time-frame test patterns can be generated using combinational ATPG.

The timeframe expansion ATPG model 900 may be generated for ATPG testing purposes in order to sufficiently test asynchronous circuits having one or more global or local feedback loops, as previously described herein. A physical circuit which is tested using the timeframe expansion ATPG model 900 generally does not include all of the replication (e.g., the replicated PCHB modules 904) when it is manufactured. Instead, the ATPG model 900 is generated for ATPG testing purposes, as the ATPG model 900 may represent asynchronous circuits in such a way that they can be tested using existing ATPG testing tools. For example, an ATPG testing tool can generate test pattern based on the generated timeframe expansion ATPG model 900, then the physical chip including the various asynchronous circuit elements that are modeled by the ATPG model 900 may be produced, which includes the DAC-scan circuitry, the PCHB circuits 104, or the like, and the test pattern generated by the ATPG testing tool based on the ATPG model 900 may be applied to the physical chip for testing. The clock signal Clk may be generated by the ATPG testing tool and input, for example, to the clock input of the latches 308 of the DAC-scan circuits 300.

Figure 10:
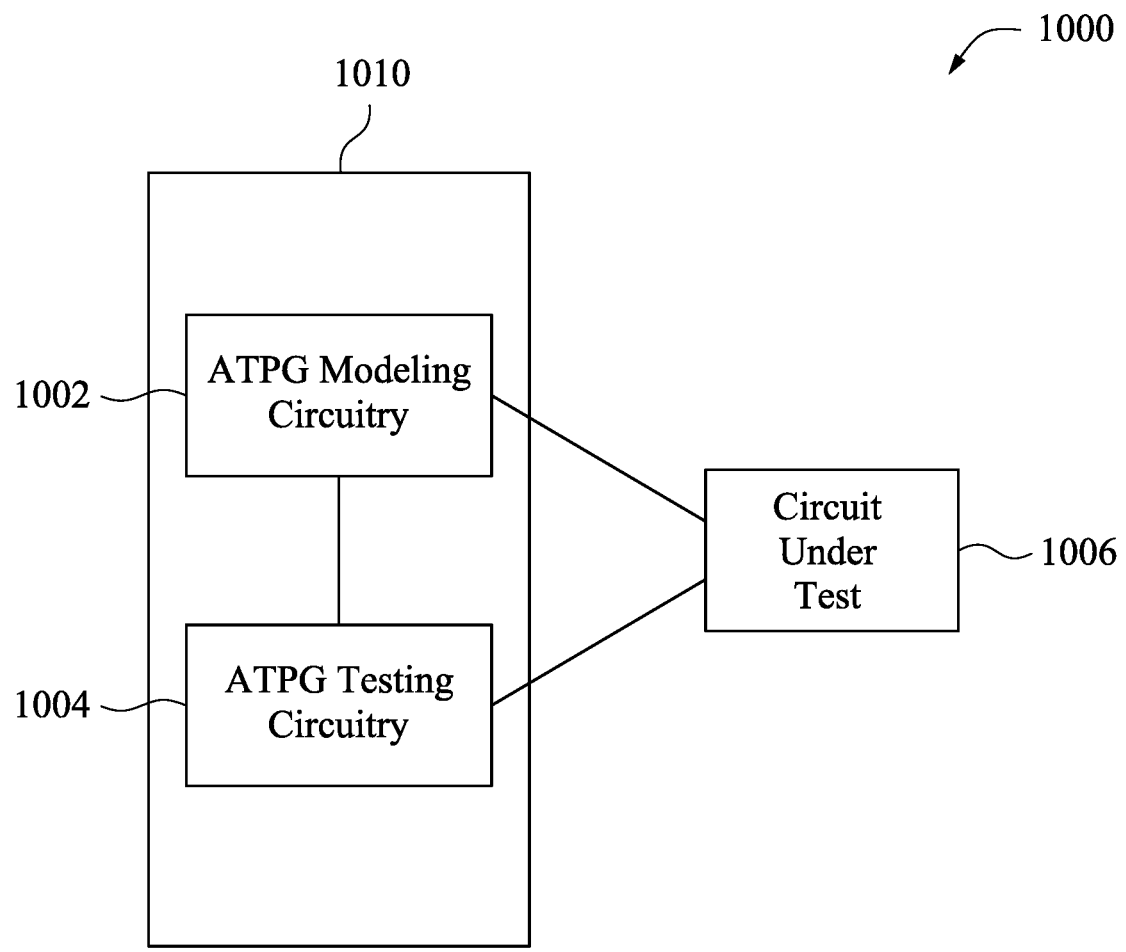
FIG. 10 is a schematic diagram illustrating an asynchronous circuit testing system, in accordance with some embodiments.

FIG. 10 is a schematic diagram illustrating an asynchronous circuit testing system 1000, in accordance with one or more embodiments. The system 1000 includes an ATPG modeling circuitry 1002 and an ATPG testing circuitry 1004. The ATPG modeling circuitry 1002 may be referred to herein as an ATPG modeling tool 1002, and the ATPG testing circuitry may be referred to herein as an ATPG testing tool 1004.

The ATPG modeling tool 1002 and the ATPG testing tool 1004 may be communicatively coupled to a circuit under test 1006, which may be, for example, any asynchronous circuit having one or more asynchronous circuit elements (e.g., PCHBs, PCFBs, etc.) such as the asynchronous cyclic pipeline circuit 100 or 500 previously described herein.

The ATPG modeling tool 1002 and the ATPG testing tool 1004 may be included as part of an asynchronous circuit test platform 1010, which may be or include any computing system operable to communicate with the circuit under test 1006 to perform various test functions such as ATPG modeling and ATPG testing. For example, the test platform 1010 may include processing circuitry, which may be or include any processing circuitry such as Central Processing Units (CPUs), Graphical Processing Units (GPUs), Application-Specific Integrated Circuits (ASICs), microcontrollers, and/or other suitable processing circuitry. The processing circuitry may be operable to perform any of the modeling and testing functions as described herein. In various embodiments, the processing circuitry may be coupled to computer-readable storage media, such as any computer-readable memory or the like, which may store instructions which, when executed by the processing circuitry, causes the processing circuitry to perform any of the modeling and testing functions described herein.

The test platform 1010 may include an interface which facilitates sending and receiving signals from the ATPG modeling tool 1002 and the ATPG testing tool 1004 and the circuit under test 1006 to perform the ATPG modeling and the ATPG testing. The test platform 1010 may include various additional electronic components, such as a display or monitor for communicating test results, input/output devices such as a mouse or keyboard, or the like.

In operation, the ATPG modeling tool 1002 analyzes the circuit under test 1006 and converts the asynchronous circuitry of the circuit under test 1006 into an equivalent ATPG model. For example, the ATPG modeling tool 1002 may insert DfT elements, such as the DAC-scan circuit 300, into one or more WCHB, PCHB, or PCFB circuit elements of the circuit under test 1006. By inserting the DAC-scan circuit 300 as a DfT element, the ATPG modeling tool 1002 may generate an ATPG model for the circuit under test 1006 in which one or more global feedback loops may be independently controlled for testing. Further, the ATPG modeling tool 1002 may convert the asynchronous circuit elements (e.g., PCHBs, PCFBs) into gate-level logic elements. For example, each of the PCHB circuit elements of the circuit under test 1006 may be modeled by the ATPG modeling tool 1002 as a PCHB model 604 or 904 as previously described herein. Moreover, the ATPG modeling tool 1002 may generate a timeframe expansion model for one or more of the asynchronous circuit elements. For example, the ATPG modeling tool 1002 may generate a timeframe expansion ATPG model 900 which represents a chain of PCHB circuit elements within the circuit under test 1006.

The ATPG modeling tool 1002 provides an ATPG model for the circuit under test 1006 to the ATPG testing tool 1004. The ATPG testing tool 1004 uses the ATPG model provided by the ATPG modeling tool 1002 to generate ATPG technique or ATPG test pattern to test the circuit under test 1006. For example, the ATPG testing tool 1004 may generate a test pattern that will distinguish or identify various types of faults that may occur or be present in the circuit under test 1006, based on the ATPG model provided from the ATPG modeling tool 1002. The ATPG testing tool 1004 may be, for example, any conventional ATPG testing tool, and may include software instructions for generating various test patterns. The test pattern generated by the ATPG testing tool 1004 may be sufficient to fully test the various global and local feedback loops within the circuit under test 1006, since the test pattern will be generated based on the ATPG model provided by the ATPG modeling tool 1002, and the ATPG model removes these feedback loops and replaces them models which can be used by the ATPG testing tool 1004, for example, as explained previously herein.

The test pattern that is generated by the ATPG testing tool 1004, based on the model provided by the ATPG modeling tool 1002, may be applied to test the circuit under test 1006, and results of the testing may be analyzed to determine, for example, faults within the circuit under test 1006.

Figure 11:
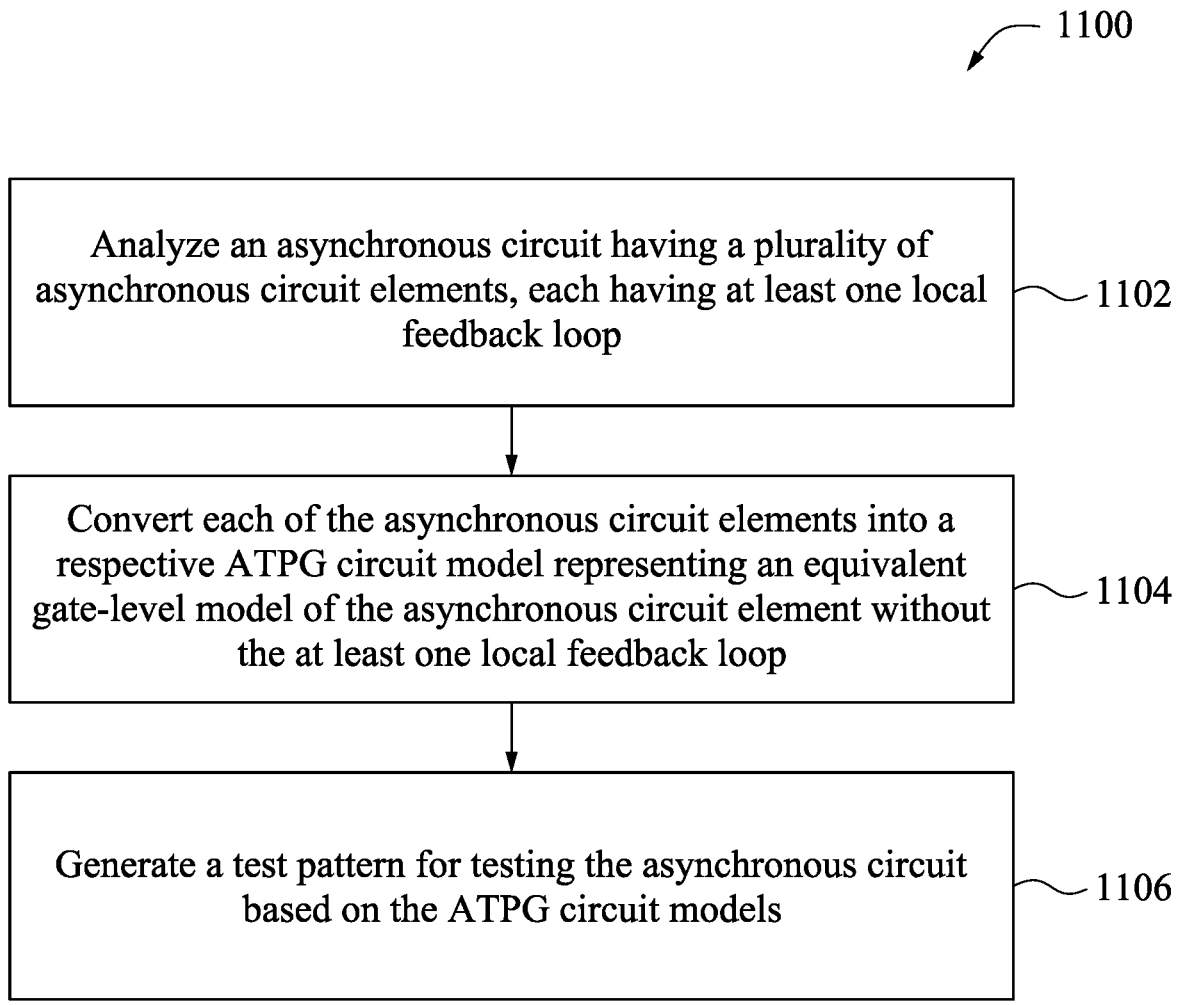
FIG. 11 is a flowchart illustrating a method for testing an asynchronous circuit, in accordance with some embodiments.

FIG. 11 is a flowchart 1100 illustrating a method for testing an asynchronous circuit, in accordance with one or more embodiments of the present disclosure.

At 1102, the method includes analyzing an asynchronous circuit having a plurality of asynchronous circuit elements, each of the plurality of asynchronous circuit elements having at least one local feedback loop. The analyzing may be performed by automated test pattern generator (ATPG) modeling circuitry, such as the ATPG modeling circuitry 1002. In some embodiments, the ATPG modeling circuitry 1002 may analyze electronic files representative of the asynchronous circuit, such as the circuit under test 1006 shown in FIG. 10. For example, the ATPG modeling circuitry 1002 may analyze electronic files which may be generated in a design phase of designing the circuit under test 1006.

At 1104, the method includes converting each of the plurality of asynchronous circuit elements into a respective ATPG circuit model. The ATPG circuit models represent equivalent gate-level models of each of the asynchronous circuit elements without the at least one local feedback loop. The converting of the asynchronous circuit elements may be performed, for example, by the ATPG modeling circuitry 1002. In some embodiments, the converting at 1104 may include converting the asynchronous circuit elements (e.g., PCHBs) into PCHB modules such as the PCHB module 604 shown and described with respect to FIG. 6, in which the PCHB circuits are represented by PCHB modules having combinational logic 612, domino logic 614, a C* element 616, a first completion detector 618, and a second completion detector 620. In some embodiments, the converting at 1104 may include performing a timeframe expansion in which a timeframe expansion ATPG model 900 is produced to represent a plurality of PCHB modules, as described with respect to FIG. 9.

At 1106, the method includes generating a test pattern for testing the asynchronous circuit based on the ATPG circuit models. The test pattern may be generated, for example, by the ATPG testing circuitry 1004, and the test pattern may be applied to a physical chip or electronic device which includes the asynchronous circuit.

Embodiments of the present disclosure provide several advantages. For example, embodiments of the disclosure are operable to test asynchronous circuits, such as asynchronous pipeline circuits, which include one or more global feedback loops. Moreover, embodiments of the present disclosure are operable to test asynchronous circuit elements which include one or more local feedback loops, such as feedback loops within a PCHB circuit and feedback loops within a C-element. Testing may be accomplished by conventional ATPG testing techniques, as embodiments of the present disclosure facilitate modeling of the various global and local feedback loops in a way in which conventional ATPG testing tools may be used.

Embodiments of the present disclosure further provide DfT elements, such as the DAC-scan circuitry, which may be included in asynchronous circuit elements in a way which allows for testing of global feedback loops in an asynchronous pipeline or chain circuit, without physically breaking the various feedback loops. This allows for insertion of the DfT elements without significantly increasing the footprint of the circuitry, for example, when formed on a chip.

The present disclosure provides, in various embodiments, asynchronous circuits, methods, and systems that may be utilized to test asynchronous circuits which may have one or more global or local feedback paths. Testing may be performed by conventional ATPG testing tools, which normally cannot sufficiently test such asynchronous circuits having global or local feedback paths.

According to one embodiment, a circuit includes a data path and a scan path. The data path has an input configured to receive a data input signal, and a first output. The scan path includes a first multiplexer having a first input configured to receive the data input signal, a latch coupled to an output of the first multiplexer, a scan isolator coupled to an output of the latch, and a second multiplexer having a first input coupled to the first output of the data path and a second input coupled to an output of the scan isolator. The second multiplexer is configured to output a data output signal.

According to another embodiment, an asynchronous circuit is provided that includes a plurality of first precharge half buffers (PCHBs), at least one second PCHB, and a first Dual-rail Asynchronous Circuit Scan (DAC-scan) circuit. The first PCHBs are arranged in a sequential chain having an input and an output. The at least one second PCHB is arranged as part of a feedback loop of the asynchronous circuit, and the at least one second PCHB has an input coupled to the output of the sequential chain, and an output coupled to a feedback loop input of the sequential chain. The first DAC-scan circuit is coupled between the output of the sequential chain and the at least one second PCHB. The first DAC-scan circuit includes a data path having a data input configured to receive a data input signal provided at an output of the sequential chain of the plurality of first PCHBs, and a first output. The scan path includes a first multiplexer having a first input configured to receive the data input signal, a latch coupled to an output of the first multiplexer, a scan isolator coupled to an output of the latch, and a second multiplexer having a first input coupled to the first output of the data path and a second input coupled to an output of the scan isolator. The second multiplexer is configured to output a data output signal.

According to yet another embodiment, a method is provided that includes analyzing, by an automated test pattern generator (ATPG) modeling circuitry, an asynchronous circuit having a plurality of asynchronous circuit elements, each of the plurality of asynchronous circuit elements having at least one local feedback loop. The ATPG modeling circuitry converts each of the plurality of asynchronous circuit elements into a respective ATPG circuit model, and the ATPG circuit models represent an equivalent gate-level model of each of the asynchronous circuit elements without the at least one local feedback loop. ATPG testing circuitry generates a test pattern for testing the asynchronous circuit based on the ATPG circuit models.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
analyzing, by an automated test pattern generator (ATPG) modeling circuitry, an asynchronous circuit having a plurality of asynchronous circuit elements, each of the plurality of asynchronous circuit elements having at least one local feedback loop;
converting, by the ATPG modeling circuitry, each of the plurality of asynchronous circuit elements into a respective ATPG circuit model, the ATPG circuit models representing an equivalent gate-level model of each of the asynchronous circuit elements without the at least one local feedback loop; and
generating, by an ATPG testing circuitry, a test pattern for testing the asynchronous circuit based on the ATPG circuit models.

2. The method of claim 1, wherein the converting each of the asynchronous circuit elements into a respective ATPG circuit model includes:
converting logical evaluation circuitry of the asynchronous circuit elements into an equivalent gate-level combinational logic block;

converting an input completion detector of the asynchronous circuit elements into an equivalent gate-level first input completion detector;

converting an output completion detector of the asynchronous circuit elements into an equivalent gate-level second input completion detector, the second input completion detector having a first input configured to receive a first input signal representative of feedback data of a first local feedback loop; and converting a portion of each of the asynchronous circuit elements into an equivalent gate-level domino logic block, the domino logic block having a first input configured to receive the first input signal representative of feedback data of the first local feedback loop and a second input coupled to an output of the combinational logic block.

3. The method of claim 2, wherein the converting each of the asynchronous circuit elements into a respective ATPG circuit model further includes:

converting a C-element of the asynchronous circuit elements into an equivalent gate-level C-element, the equivalent gate-level C-element including a first input coupled to an output of the first input completion detector, a second input coupled to an output of the second input completion detector, and a third input configured to receive a second input signal representative of feedback data of a second local feedback loop, the second local feedback loop being a feedback loop internal to the C-element of the asynchronous circuit elements.

4. The method of claim 1, further comprising:

arranging the ATPG circuit models for each of the asynchronous circuit elements along a first row of an array of ATPG circuit models;

generating a plurality of duplicate ATPG circuit models for each of the ATPG circuit models arranged in the first row; and arranging the duplicate ATPG circuit models for each of the ATPG circuit models in a respective column of the array which includes the respective ATPG circuit.

5. The method of claim 4, further comprising:

coupling a data output of the ATPG circuit models in the first row of the array to a first feedback data input of the duplicate ATPG circuit models in a second row of the array.

6. The method of claim 5, further comprising:

coupling an acknowledgement signal output of the ATPG circuit models in the first row of the array to a second feedback data input of the duplicate ATPG circuit models in a second row of the array.

7. A method, comprising:

analyzing, by automated test pattern generator (ATPG) modeling circuitry, an asynchronous circuit including a plurality of precharge half buffers (PCHBs) arranged in a loop, each of the PCHBs including at least one local feedback loop; and converting, by the ATPG modeling circuitry, each of the PCHBs into a respective ATPG circuit model, the ATPG circuit models representing an equivalent gate-level model of each of the PCHBs without the at least one local feedback loop.

8. The method of claim 7, further comprising:

generating, by ATPG testing circuitry, a test pattern for testing the asynchronous circuit based on the ATPG circuit models.

9. The method of claim 7, wherein the plurality of PCHBs includes:

a plurality of first precharge half buffers (PCHBs) arranged in a sequential chain having an input and an output; and at least one second PCHB arranged as a feedback loop of the asynchronous circuit, the at least one second PCHB having an input coupled to the output of the sequential chain, and an output coupled to a feedback loop input of the sequential chain.

10. The method of claim 9, wherein the asynchronous circuit includes a first Dual-rail Asynchronous Circuit Scan (DAC-scan) circuit coupled between the output of the sequential chain and the at least one second PCHB, the method further comprising:

converting a C-element of the DAC-scan circuit into an equivalent gate-level C-element, the equivalent gate-level C-element.

11. The method of claim 7, further comprising:

arranging the ATPG circuit models for each of the PCHBs along a first row of an array of ATPG circuit models;

generating a plurality of duplicate ATPG circuit models for each of the ATPG circuit models arranged in the first row; and arranging the duplicate ATPG circuit models for each of the ATPG circuit models in a respective column of the array which includes the respective ATPG circuit.

12. The method of claim 11, further comprising:

coupling a data output of the ATPG circuit models in the first row of the array to a first feedback data input of the duplicate ATPG circuit models in a second row of the array.

13. The method of claim 12, further comprising:

coupling an acknowledgement signal output of the ATPG circuit models in the first row of the array to a second feedback data input of the duplicate ATPG circuit models in a second row of the array.

14. The method of claim 7, further comprising:

converting logical evaluation circuitry of the asynchronous circuit into an equivalent gate-level combinational logic block;

converting an input completion detector of the asynchronous circuit into an equivalent gate-level first input completion detector; and converting an output completion detector of the asynchronous circuit into an equivalent gate-level second input completion detector, the second input completion detector having a first input configured to receive a first input signal representative of feedback data of a first local feedback loop.

15. A method, comprising:

analyzing an asynchronous circuit having a plurality of asynchronous circuit elements, each of the plurality of asynchronous circuit elements having at least one local feedback loop, the plurality of asynchronous circuit elements including:

a plurality of first precharge half buffers (PCHBs) arranged in a sequential chain having an input and an output;

at least one second PCHB arranged as a feedback loop of the asynchronous circuit, the at least one second PCHB having an input coupled to the output of the sequential chain, and an output coupled to a feedback loop input of the sequential chain; and a first Dual-rail Asynchronous Circuit Scan (DAC-scan) circuit coupled between the output of the sequential chain and the at least one second PCHB; and converting each of the plurality of asynchronous circuit elements into a respective ATPG circuit model, the ATPG circuit models representing an equivalent gate-level model of each of the asynchronous circuit elements without the at least one local feedback loop.

16. The method of claim 15, further comprising generating a test pattern for testing the asynchronous circuit based on the ATPG circuit models.

17. The method of claim 15 wherein the converting each of the asynchronous circuit elements into a respective ATPG circuit model further includes:
converting a C-element of the asynchronous circuit elements into an equivalent gate-level C-element.

18. The method of claim 15, further comprising:
arranging the ATPG circuit models for each of the asynchronous circuit elements along a first row of an array of ATPG circuit models;

generating a plurality of duplicate ATPG circuit models for each of the ATPG circuit models arranged in the first row; and arranging the duplicate ATPG circuit models for each of the ATPG circuit models in a respective column of the array which includes the respective ATPG circuit.

19. The method of claim 18, further comprising:
coupling a data output of the ATPG circuit models in the first row of the array to a first feedback data input of the duplicate ATPG circuit models in a second row of the array.

20. The method of claim 19, further comprising:
coupling an acknowledgement signal output of the ATPG circuit models in the first row of the array to a second feedback data input of the duplicate ATPG circuit models in a second row of the array.

* * * * *